United States Patent
Lee et al.

(10) Patent No.: US 11,277,124 B2
(45) Date of Patent: Mar. 15, 2022

(54) OVERCURRENT DETECTION REFERENCE COMPENSATION SYSTEM OF SWITCHING ELEMENT FOR INVERTER AND OVERCURRENT DETECTION SYSTEM USING THE SAME

(71) Applicants: Hyundai Motor Company, Seoul (KR); Kia Motors Corporation, Seoul (KR)

(72) Inventors: Yoo Jong Lee, Gyeonggi-do (KR); Ji Woong Jang, Gyeonggi-do (KR); Ki Jong Lee, Gyeonggi-do (KR); Sang Cheol Shin, Gyeonggi-do (KR)

(73) Assignees: Hyundai Motor Company, Seoul (KR); Kia Motors Corporation, Seoul (KR)

(*) Notice: Subject to any disclaimer, the term of this patent is extended or adjusted under 35 U.S.C. 154(b) by 0 days.

(21) Appl. No.: 16/923,703

(22) Filed: Jul. 8, 2020

(65) Prior Publication Data
US 2021/0036699 A1  Feb. 4, 2021

(30) Foreign Application Priority Data
Aug. 1, 2019 (KR) .................. 10-2019-0093840

(51) Int. Cl.
*H03K 17/082* (2006.01)
*H02M 7/525* (2006.01)
*H03K 17/0812* (2006.01)
*H03K 17/18* (2006.01)
*H03K 17/08* (2006.01)

(52) U.S. Cl.
CPC ........ *H03K 17/0828* (2013.01); *H02M 7/525* (2013.01); *H03K 17/0812* (2013.01); *H03K 17/18* (2013.01); *H03K 2017/0806* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,280,228 | A * | 1/1994 | Kanouda | H02M 7/53875 318/801 |
| 10,700,632 | B1 * | 6/2020 | Yoo | H02P 29/67 |
| 2008/0186751 | A1 * | 8/2008 | Tokuyama | H02M 7/537 363/131 |
| 2010/0076647 | A1 * | 3/2010 | Kamichi | H02J 7/045 701/36 |
| 2010/0097765 | A1 * | 4/2010 | Suzuki | B60K 6/405 361/699 |
| 2013/0060499 | A1 * | 3/2013 | Yoshimura | G01K 15/005 702/99 |
| 2014/0063860 | A1 * | 3/2014 | Suzuki | H02M 1/4258 363/17 |
| 2014/0122815 | A1 * | 5/2014 | Iwakoshi | G06F 13/18 711/158 |
| 2014/0368136 | A1 * | 12/2014 | Celik | H02P 6/15 318/400.04 |

(Continued)

*Primary Examiner* — Adam D Houston
(74) *Attorney, Agent, or Firm* — Mintz Levin Cohn Ferris Glovsky and Popeo, P.C.; Peter F. Corless

(57) ABSTRACT

An overcurrent detection reference compensation system of a switching element for an inverter and an overcurrent detection system using the same can correct an overcurrent detection reference used to detect an overcurrent of a switching element according to a temperature of the switching element.

8 Claims, 7 Drawing Sheets

(56) References Cited

U.S. PATENT DOCUMENTS

| | | | | |
|---|---|---|---|---|
| 2015/0189784 A1* | 7/2015 | Hirano | ............... | H05K 7/02 |
| | | | | 361/728 |
| 2015/0200677 A1* | 7/2015 | Ainspan | ............... | H03L 7/0992 |
| | | | | 327/158 |
| 2016/0087561 A1* | 3/2016 | Rho | ............... | H02P 6/28 |
| | | | | 318/400.04 |
| 2016/0276975 A1* | 9/2016 | Fujishima | ............... | H02P 29/685 |
| 2017/0063367 A1* | 3/2017 | Tsurumaru | ............... | H02P 27/08 |
| 2017/0093390 A1* | 3/2017 | Tsurumaru | ............... | H03K 17/08128 |
| 2017/0126115 A1* | 5/2017 | Schulz | ............... | H02M 7/53871 |
| 2017/0264199 A1* | 9/2017 | Kimura | ............... | H02M 3/158 |
| 2018/0019700 A1* | 1/2018 | Suzuki | ............... | G03G 21/16 |
| 2018/0065486 A1* | 3/2018 | Kasagi | ............... | B60L 3/003 |
| 2018/0175849 A1* | 6/2018 | Shimizu | ............... | H03K 17/18 |
| 2018/0183378 A1* | 6/2018 | Tsubota | ............... | H02M 1/08 |
| 2019/0007039 A1* | 1/2019 | Narumi | ............... | H02M 7/537 |
| 2019/0078943 A1* | 3/2019 | Nakayama | ............... | B60L 3/0046 |
| 2019/0375449 A1* | 12/2019 | Takase | ............... | H02P 21/06 |
| 2020/0018534 A1* | 1/2020 | Tsuchiya | ............... | F25B 31/02 |
| 2020/0130730 A1* | 4/2020 | Takase | ............... | H02P 27/06 |
| 2020/0228110 A1* | 7/2020 | Akahane | ............... | H02M 1/08 |
| 2020/0274375 A1* | 8/2020 | Griffiths | ............... | H02J 7/1423 |
| 2020/0365167 A1* | 11/2020 | Shanmugam | ............... | G10L 25/84 |
| 2021/0036699 A1* | 2/2021 | Lee | ............... | H02M 1/32 |
| 2021/0067040 A1* | 3/2021 | Nakano | ............... | H02M 7/53871 |

\* cited by examiner

OVERCURRENT DETECTION REFERENCE COMPENSATION SYSTEM OF SWITCHING ELEMENT FOR INVERTER AND OVERCURRENT DETECTION SYSTEM USING THE SAME

CROSS-REFERENCE TO RELATED APPLICATION

This application claims under 35 U.S.C. § 119(a) the benefit of Korean Patent Application No. 10-2019-0093840 filed on Aug. 1, 2019, the entire contents of which are incorporated herein by reference.

BACKGROUND

(a) Technical Field

The present disclosure relates to an overcurrent detection reference compensation system of a switching element for an inverter and an overcurrent detection system using the same, more particularly, to the overcurrent detection reference compensation system for compensating for a deviation of an overcurrent detection reference which is used for overcurrent detection of a switching element, and the overcurrent detection system using the same.

(b) Description of the Related Art

Generally, a vehicle using an electric motor as a driving source employs an inverter so as to generate an alternating current (AC) which is supplied to the electric motor. The inverter has a switching module which interrupts a current for driving the electric motor, and the switching module typically includes a plurality of switching elements which are capable of interrupting a flow of current.

Conventionally, a silicon-based insulated gate bipolar transistor (IGBT) is used as a switching element for an inverter. However, the IGBT has a large switching loss and a large conduction loss at a low load such that there is a problem of degrading efficiency of the inverter.

In order to overcome the above problem of the IGBT, research for employing a silicon carbide (SiC)-based field effect transistor (FET) as a switching element for an inverter is being carried out.

When compared with the silicon-based IGBT, the SiC-based FET has an advantage of having a low switching loss and a low conduction loss at a low load. However, since a voltage $V_{DS}$-current $I_{ds}$ characteristic of the FET is varied in a drain-source section as a temperature of the FET is varied, application of a critical voltage, which serves as a reference when an overcurrent is flowing in the FET, is limited. The critical voltage is a threshold voltage at which a driving region of the FET is switched from a saturation region to a desaturation region.

SUMMARY

In one aspect, the present disclosure provides an overcurrent detection reference compensation system of a switching element for an inverter, which compensates for an overcurrent detection reference used in detecting an overcurrent of a switching element according to a temperature of the switching element, and an overcurrent detection system using the same.

In a preferred embodiment, an overcurrent detection reference compensation system for an inverter, which includes a switching module having a plurality of switching elements which are connected in series, a temperature detector configured to detect a temperature of each of the switching elements, a correction reference determiner configured to calculate a difference between a set reference temperature and a temperature of at least one of the switching elements detected by the temperature detector, and determine a correction reference according to the calculated difference, and a detection reference corrector configured to correct an overcurrent detection reference of each of the switching elements using the correction reference.

According to the embodiments of the present disclosure, the temperature detector may include a diode module which is disposed in a housing in which the switching elements are embedded and receives a constant current, and a temperature estimator configured to estimate, when the constant current is supplied to the diode module, a temperature of each of the switching elements on the basis of a voltage across both terminals of the diode module. The temperature estimator may estimate the temperature of each of the switching elements using a temperature determination map in which the voltage across both terminals of the diode module is an input and the temperature of each of the switching elements is an output.

Further, according to the embodiments of the present disclosure, the correction reference determiner may include a gain selector configured to determine a correction gain according to a difference between the temperature of at least one of the switching elements and the reference temperature, and a correction reference calculator configured to calculate the correction reference according to the difference using the correction gain. Further, the detection reference corrector may calculate an overcurrent detection reference in which the deviation according to the temperature of each of the switching elements is corrected by adding the correction reference to the overcurrent detection reference.

In another preferred embodiment, an overcurrent detection system for an inverter, which includes a switching module having a plurality of switching elements which are connected in series, a temperature detector configured to detect a temperature of each of the switching elements, a correction reference determiner configured to calculate a difference between a set reference temperature and a temperature of at least one of the switching elements detected by the temperature detector, and determine a correction reference according to the calculated difference, a detection reference corrector configured to correct an overcurrent detection reference of the switching elements using the correction reference, and an overcurrent detector configured to determine whether an overcurrent flows in the switching elements according to a result of comparing the overcurrent detection reference corrected in the detection reference corrector with a drain-source voltage of the switching elements.

According to the embodiments of the present disclosure, the overcurrent detector may include a voltage signal receiver which receives information on the drain-source voltage of the switching elements, and an overcurrent determiner configured to determine, when the drain-source voltage received from the voltage signal receiver is equal to or less than the overcurrent detection reference corrected in the detection reference corrector, that the overcurrent is applied to the switching elements. When the drain-source voltage received from the voltage signal receiver exceeds the overcurrent detection reference corrected in the detection reference corrector, the overcurrent determiner determines that the overcurrent is not applied to the switching elements.

Other aspects and preferred embodiments of the disclosure are discussed infra.

BRIEF DESCRIPTION OF THE DRAWINGS

The above and other features of the present disclosure will now be described in detail with reference to certain exemplary embodiments thereof illustrated the accompanying drawings which are given hereinbelow by way of illustration only, and thus are not limitative of the present disclosure, and wherein.

Figure 1:
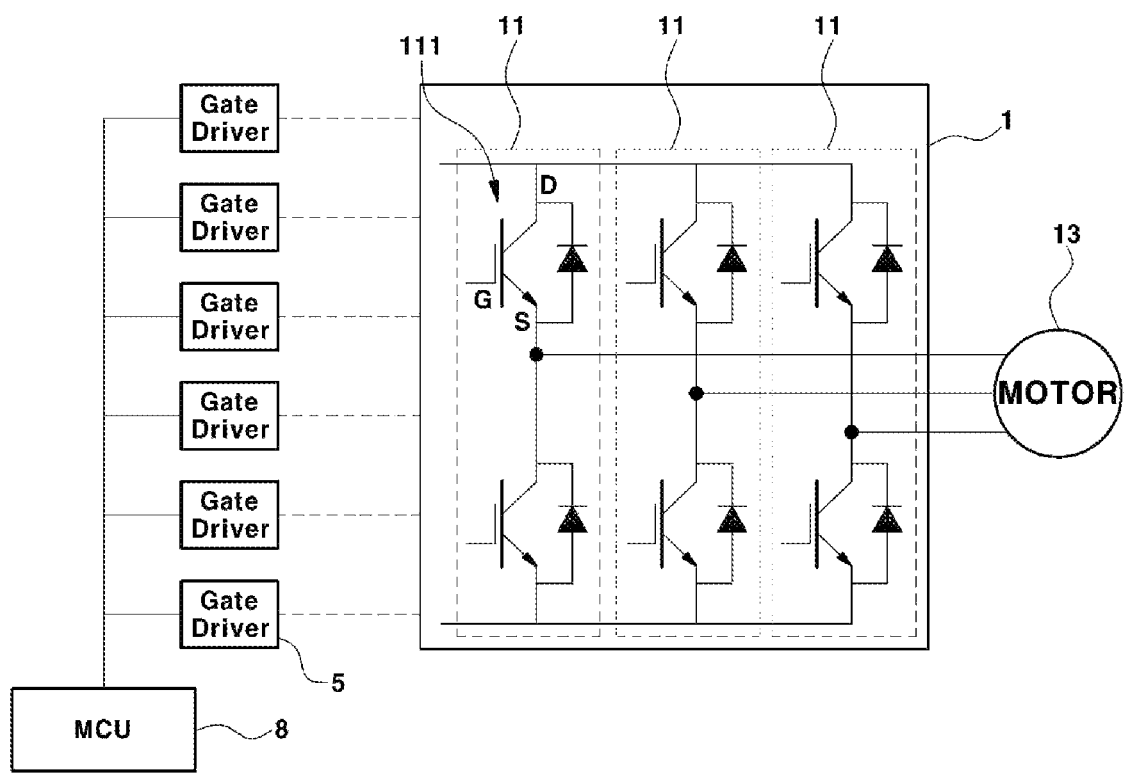
FIG. 1 is a configurational diagram illustrating an inverter.

It should be understood that the appended drawings are not necessarily to scale, presenting a somewhat simplified representation of various preferred features illustrative of the basic principles of the disclosure. The specific design features of the present disclosure as disclosed herein, including, for example, specific dimensions, orientations, locations, and shapes will be determined in part by the particular intended application and use environment.

In the figures, reference numbers refer to the same or equivalent parts of the present disclosure throughout the several figures of the drawing.

DETAILED DESCRIPTION

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g., fuels derived from resources other than petroleum). As referred to herein, a hybrid vehicle is a vehicle that has two or more sources of power, for example both gasoline-powered and electric-powered vehicles.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Throughout the specification, unless explicitly described to the contrary, the word "comprise" and variations such as "comprises" or "comprising" will be understood to imply the inclusion of stated elements but not the exclusion of any other elements. In addition, the terms "unit", "-er", "-or", and "module" described in the specification mean units for processing at least one function and operation, and can be implemented by hardware components or software components and combinations thereof.

Further, the control logic of the present disclosure may be embodied as non-transitory computer readable media on a computer readable medium containing executable program instructions executed by a processor, controller or the like. Examples of computer readable media include, but are not limited to, ROM, RAM, compact disc (CD)-ROMs, magnetic tapes, floppy disks, flash drives, smart cards and optical data storage devices. The computer readable medium can also be distributed in network coupled computer systems so that the computer readable media is stored and executed in a distributed fashion, e.g., by a telematics server or a Controller Area Network (CAN).

Hereinafter reference will now be made in detail to various embodiments of the present disclosure, examples of which are illustrated in the accompanying drawings and described below. While the disclosure will be described in conjunction with exemplary embodiments, it will be understood that present description is not intended to limit the disclosure to those exemplary embodiments. On the contrary, the disclosure is intended to cover not only the exemplary embodiments, but also various alternatives, modifications, equivalents and other embodiments, which may be included within the spirit and scope of the disclosure as defined by the appended claims.

Hereinafter, exemplary embodiments of the present disclosure will be described in detail with reference to the accompanying drawings.

A silicon carbide (SiC)-based field effect transistor (FET) may be used as a switching element 111 of an inverter 1 shown in FIG. 1.

Figure 2:
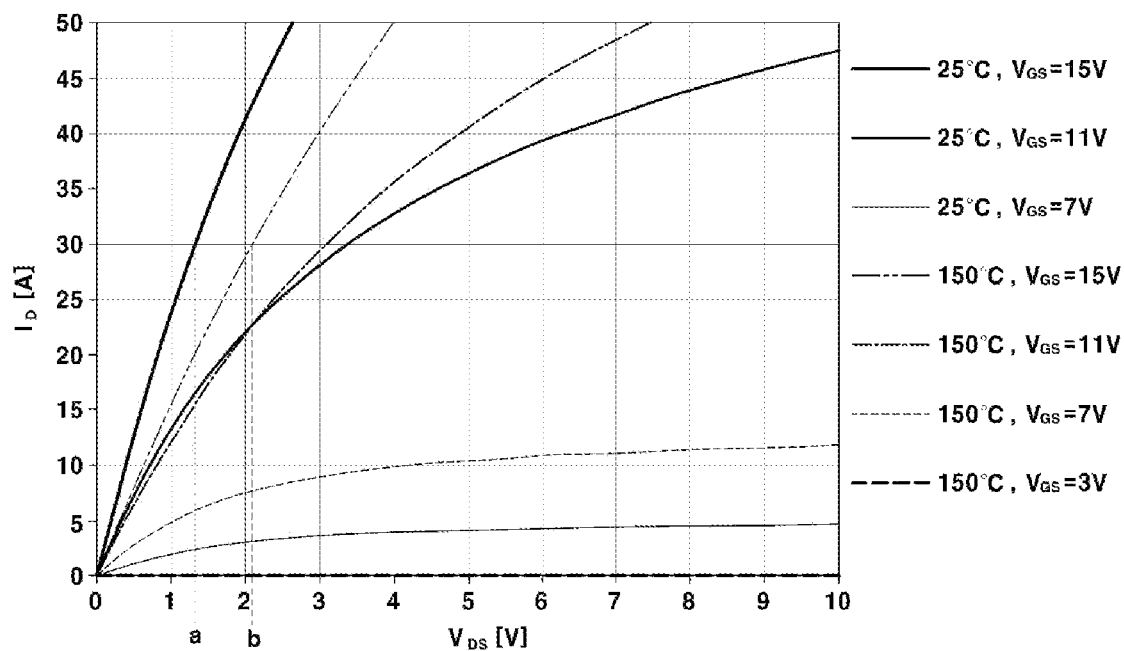
FIG. 2 is a graph showing a voltage-current characteristic of a switching element for the inverter.

FIG. 2 is a graph showing a voltage $V_{DS}$-current $I_D$ characteristic in a drain-source section according to a temperature and a gate-source voltage $V_{GS}$ of the FET.

As shown in FIG. 2, as a temperature of the FET rises, a slope of a voltage $V_{DS}$-current $I_D$ graph in the drain-source section decreases gradually. When the gate-source voltage $V_{GS}$ of the FET is 15 V, a temperature of the FET is 25° C., and a drain current $I_D$ of the FET is 30 A, a voltage $V_{DS}$ of the drain-source section becomes a. However, when the temperature of the transistor is 150° C. and the drain current $I_D$ of the transistor is 30 A, the voltage $V_{DS}$ in the drain-source section becomes b (b>a). That is, as the temperature of the transistor rises, the voltage $V_{DS}$ in the drain-source section is increased.

When the voltage $V_{DS}$ in the drain-source section of the transistor is decreased to reach a critical voltage, it may be determined that an overcurrent flows into a drain terminal D of the transistor. Thus, it is possible to determine whether the overcurrent occurs in the transistor according to the voltage $V_{DS}$ in the drain-source section of the transistor. The critical voltage is a threshold voltage at which a driving region of the transistor is switched from a saturation region to a desaturation region. A region in which the transistor operates may be divided into a saturation region and a desaturation region. When the transistor operates in the saturation region, the transistor operates normally, and when the transistor operates in the desaturation region, the transistor operates abnormally.

Since the voltage $V_{DS}$ in the drain-source section is varied according to the temperature of the transistor, in order to accurately detect generation of an overcurrent of the transistor by monitoring the voltage $V_{DS}$ in the drain-source section, it is necessary to correct the critical voltage according to a temperature deviation of the transistor. When the correction is not performed, as the temperature of the transistor rises, the driving region of the transistor is relatively rapidly switched to the desaturation region with respect to a reference temperature (e.g., a room temperature). As a result, the critical voltage is lowered and thus it is difficult to detect the overcurrent of the transistor at a desired current level. Further, a problem may occur in which an overcurrent is mis-determined as being introduced into the transistor even before the inverter outputs a maximum current.

Accordingly, the present disclosure provides an overcurrent detection reference compensation system for correcting a critical voltage (i.e., an overcurrent detection reference), which is used to determine whether an overcurrent flows in the switching element 111, according to a temperature of the switching element 111. The overcurrent detection reference compensation system may correct the overcurrent detection reference according to the temperature of the switching element 111, thereby improving accuracy of the overcurrent detection reference and detection accuracy of an overcurrent which is applied to the switching element 111. The switching element 111 may be the above-described FET.

Referring to FIG. 1, the inverter 1 is configured to convert a direct-current (DC) current, which is input to the inverter 1, into a three-phase AC current and output the three-phase AC current and is comprised of three switching modules 11, which implement phase currents, connected in parallel. The switching module 11 may be comprised of a plurality of switching elements 111 which are capable of interrupting a flow of a current. Specifically, the switching module 11 may be comprised of two switching elements 111 which are connected in series.

The inverter 1 may be connected to a plurality of gate drivers 5 which control gate voltages of the switching elements 111. Operations of the gate drivers 5 may be controlled by a motor controller 8 of a vehicle. The gate drivers 5 may be connected to gate terminals G of the switching elements 111. The inverter 1 may be a power converter for generating an AC current which is supplied to a drive motor 13 for a vehicle.

Figure 3:
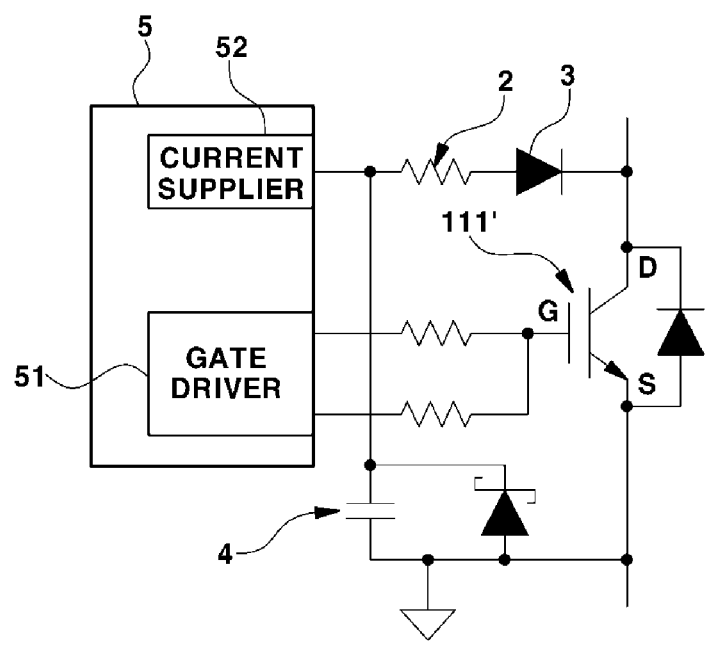
FIG. 3 is a diagram illustrating the switching element connected to a gate driver.

Referring to FIG. 3, the gate driver 5 may include a gate driver 51 which is capable of triggering a switching element 111' by applying a driving voltage (i.e., a gate-source voltage) to a gate terminal G of the switching element 111', and a current supplier 52 for generating a current (i.e., a drain current) applied to a drain terminal D of the switching element 111'. According to a gate-source voltage $V_{GS}$ applied to the switching element 111' through the gate driver 51 and a drain current $I_D$ applied to the switching element 111' through the current supplier 52, a drain-source voltage $V_{DS}$ of the switching element 111' may be varied.

Referring to FIG. 3, a diode 3 which is connected to a first resistor 2 in series is connected to the drain terminal D of the switching element 111', and the first resistor 2 is connected to a capacitor 4 in parallel. The first resistor 2 and the capacitor 4 are connected to the current supplier 52. A constant current which is output from the current supplier 52 flows through the first resistor 2 and the diode 3 to be applied to the drain terminal D of the switching element 111'. Accordingly, a voltage drop occurs due to the first resistor 2, the diode 3, and the switching element 111'. A critical voltage of the switching element 111' may be determined on the basis of the voltage drop which occurs due to the first resistor 2, the diode 3, and the switching element 111'. The critical voltage determined as described above may be used as an overcurrent detection reference V of the switching element 111'.

When an overcurrent that is higher than a normal current, which is output from the current supplier 52, is applied to the drain terminal D, the driving region of the switching element 111' is switched from a saturation region to a desaturation region. When the driving region of the switching element 111' reaches the saturation region, the drain-source voltage $V_{DS}$ of the switching element 111' reaches a saturation voltage. Further, when the driving region of the switching element 111' is switched from the saturation region to the desaturation region, the voltage $V_{DS}$ in the drain-source section is decreased below the critical voltage.

Since a drain-source voltage $V_{DS}$ of a switching element may be varied according to a temperature of the switching element, in order to accurately detect occurrence of an overcurrent of the switching element, it is necessary to correct a deviation of an overcurrent detection reference V according to the temperature of the switching element.

Figure 4:
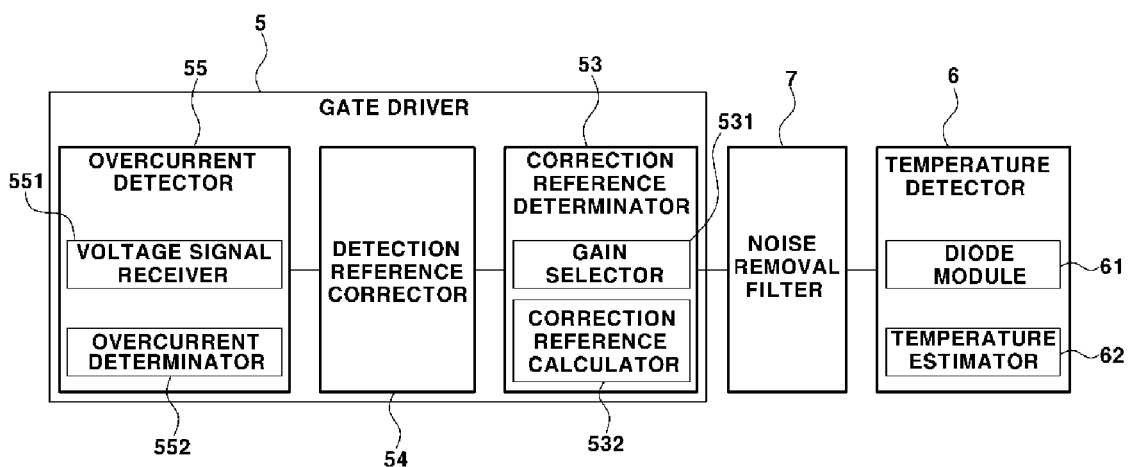
FIG. 4 is a block diagram illustrating an overcurrent detection system using an overcurrent detection reference compensation system according to the present disclosure.

The overcurrent detection reference compensation system according to the present disclosure is configured to be able to compensate for a deviation of an overcurrent detection reference V according to a temperature of a switching element. Referring to FIG. 4, the overcurrent detection reference compensation system may include a temperature detector 6, a correction reference determiner 53, and a detection reference corrector 54. The correction reference determiner 53 and the detection reference corrector 54 may be provided in the gate driver 5 for a switching element.

Figure 5:
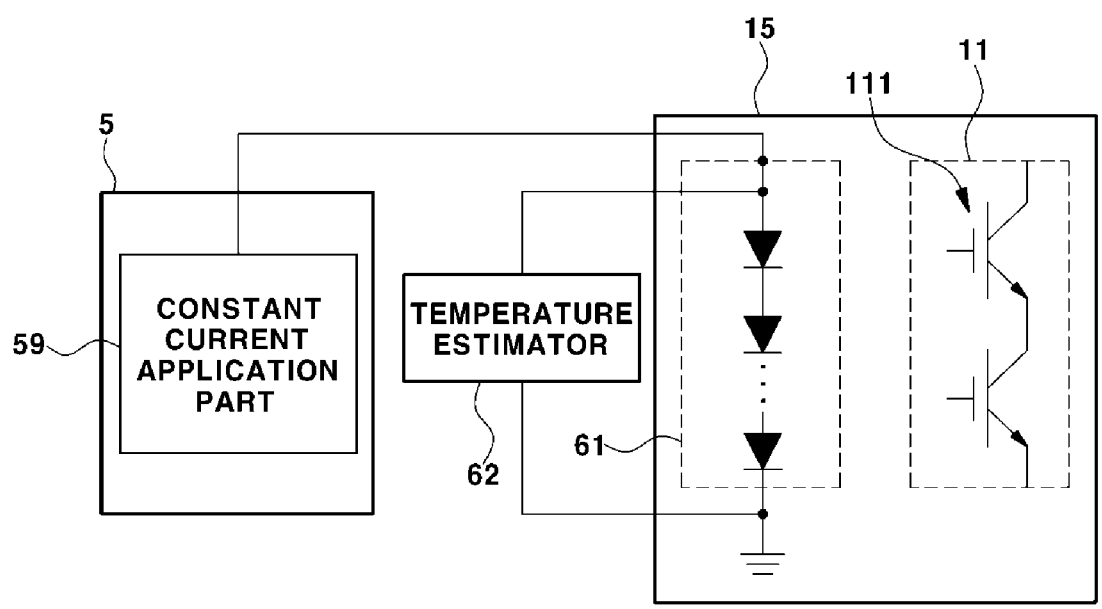
FIG. 5 is a diagram illustrating a temperature detector according to the present disclosure.

The temperature detector 6 may be configured to detect a temperature of the switching element 111 in real time. Referring to FIGS. 4 and 5, the temperature detector 6 may include a diode module 61 and a temperature estimator 62.

The diode module 61 may be connected to a constant current application part 59 to receive a constant current therefrom. The diode module 61 may be composed of a single diode or two or more diodes which are connected in series. The diode module 61 may be disposed in a housing 15 in which the switching element 111 is embedded. Specifically, the diode module 61 may be mounted in the housing 15 of the switching element 111 and disposed adjacent to the switching element 111. The diode module 61 may be directly affected by a temperature of the switching element 111. Accordingly, the temperature of the switching element 111 may be accurately detected. The constant current application part 59 may be provided in the gate driver 5. That is, the gate driver 5 may include the constant current application part 59.

The temperature estimator 62 may estimate the temperature of the switching element 111 on the basis of a voltage across both terminals of the diode module 61. When a constant current is supplied from the constant current application part 59 to the diode module 61, the temperature estimator 62 senses the voltage across both terminals of the diode module 61. The temperature estimator 62 may derive the temperature of the switching element 111 on the basis of a voltage value between both terminals of the diode module 61. Specifically, when the constant current is applied to the diode module 61, the temperature detector 6 may sense a voltage value according to a variation in temperature of the diode module 61 to detect the temperature of the switching element 111.

The temperature estimator 62 may include a temperature determination map which is configured to determine the temperature of the switching element 111 according to the voltage value between both terminals of the diode module 61. The temperature estimator 62 may derive a real-time temperature of the switching element 111 using the temperature determination map. The temperature determination map may be configured as a map table using the voltage value between both terminals of the diode module 61 as an input value and a temperature value of the switching element 111 as an output value. Alternatively, the temperature determination map may be constructed using data which is derived through a pre-test and evaluation.

The temperature of the switching element 111 may be estimated on the basis of a thermal model analysis using a temperature of a direct bonded copper (DBC) substrate in which a negative temperature coefficient (NTC) thermistor is embedded. However, when the temperature of the switching element 111 is estimated using the NTC thermistor, estimation accuracy is lowered such that a large difference occurs between the estimated temperature of the switching element 111 and an actual temperature thereof. On the other hand, when the temperature of the switching element 111 is estimated using the diode module 61, it is possible to estimate the temperature of the switching element 111 with high accuracy due to a characteristic of the diode. The diode has a characteristic that a voltage drop value is varied according to an ambient temperature.

Temperature information of the switching element 111, which is detected by the temperature detector 6, may be input to the correction reference determiner 53 through a noise removal filter 7. That is, the noise removal filter 7 may be connected between the temperature detector 6 and the correction reference determiner 53. A common mode (CM) filter for selectively removing noise included in an input signal may be applied as the noise removal filter 7. The noise removal filter 7 may remove a noise component mixed in the temperature information which is output from the temperature detector 6. The noise removal filter 7 may protect the temperature information on the switching element 111 from external noise.

The correction reference determiner 53 may be configured to calculate a difference between the temperature of the switching element 111, which is detected by the temperature detector 6, and a set reference temperature T and determine a correction reference V1 according to the calculated difference. The correction reference determiner 53 may include a gain selector 531 for determining a correction gain according to the calculated difference and a correction reference calculator 532 for calculating the correction reference V1 according to the calculated difference using the determined correction gain.

The gain selector 531 may include a gain determination map which is configured to determine the correction gain according to the difference (i.e., a temperature deviation of the switching element 111) between the temperature of the switching element 111 and the reference temperature T. That is, the gain selector 531 may select the correction gain using the gain determination map. The gain determination map may be configured to determine a correction gain which is proportional to the temperature deviation. That is, the gain selector 531 may select a correction gain proportional to the temperature deviation.

The correction reference calculator 532 may be configured to determine the correction reference V1 as a value which is obtained by multiplying the temperature deviation by the correction gain. The correction reference V1 may be calculated as a value proportional to the temperature deviation of the switching element 111. The correction reference calculator 532 may generate a signal corresponding to the correction reference V1 using an operational amplifier which is capable of amplifying a signal of the temperature deviation according to the correction gain. The correction reference V1 is a compensation value for correcting a deviation of the overcurrent detection reference V due to the temperature of the switching element 111. That is, the correction reference V1 may be used to correct the deviation of the overcurrent detection reference V. Further, the detection reference corrector 54 may be configured to correct the overcurrent detection reference V of the switching element 111 using the correction reference V1 which is input from the correction reference determiner 53. The detection reference corrector 54 may determine an overcurrent detection reference V' in which the temperature deviation of the switching element 111 is corrected by adding the correction reference V1 to the overcurrent detection reference V at the reference temperature T. That is, the detection reference corrector 54 may calculate the overcurrent detection reference V' in which the deviation due to the temperature of the switching element 111 is corrected by adding the correction reference V1 and the overcurrent detection reference V. In other words, the detection reference corrector 54 may compensate for the deviation of the overcurrent detection reference V due to the temperature deviation of the switching element 111 with respect to the reference temperature T.

Here, the overcurrent detection reference V is a reference voltage value which is used to detect an overcurrent generated in the switching element 111 at the set reference temperature T. The reference voltage value may be set to a critical voltage at which the voltage $V_{DS}$ in the drain-source section of the switching element 111 is switched from a saturation voltage to a desaturation voltage.

Further, the corrected overcurrent detection reference V' is a reference voltage value in which a deviation of the overcurrent detection reference V generated according to a difference between the temperature of the switching element 111, which is estimated by the temperature detector 6, and the reference temperature T. When a temperature deviation of the switching element 111 with respect to the reference temperature T is present, the corrected overcurrent detection reference V' may be used to detect an overcurrent flowing in the switching element 111.

Further, the reference temperature T may be set to a room temperature at which a normal operation of the switching element 111 is possible. For example, the reference temperature T may be a temperature ranging from 25° C. to 30° C.

An overcurrent detection system for detecting an overcurrent of a switching element may be configured using the overcurrent detection reference compensation system which is configured as described above.

Referring to FIG. 4, the overcurrent detection system may include an overcurrent detector 55 in addition to the temperature detector 6, the correction reference determiner 53, and the detection reference corrector 54.

The overcurrent detector 55 may receive the overcurrent detection reference V' corrected in the detection reference corrector 54 and receive an actual drain-source voltage $V_{DS}$ of the switching element 111, which is monitored and measured in real time. The overcurrent detector 55 may compare the overcurrent detection reference V' with the drain-source voltage $V_{DS}$ and determine whether an overcurrent occurs in the switching element 111 according to the comparison result.

Specifically, the overcurrent detector 55 may include a voltage signal receiver 551 for receiving information on the drain-source voltage $V_{DS}$ of the switching element 111 and an overcurrent determiner 552 for determining, when the voltage $V_{DS}$ in the drain-source section received from the voltage signal receiver 551 is equal to or less than the overcurrent detection reference V' corrected in the detection reference corrector 54, an overcurrent as occurring in the switching element 111.

The voltage signal receiver 551 may receive the information on the drain-source voltage $V_{DS}$ from a voltage measuring part which is capable of measuring the drain-source voltage $V_{DS}$ of the switching element 111.

When the voltage $V_{DS}$ in the drain-source section received from the voltage signal receiver 551 exceeds the overcurrent detection reference V' corrected in the detection reference corrector 54, the overcurrent determiner 552 may determine that an overcurrent does not occur in the switching element 111.

Since the overcurrent detection system, which is configured as described above, detects the overcurrent of the switching element using the corrected overcurrent detection reference V', the overcurrent detection system may accurately detect the overcurrent flowing in the switching element regardless of a variation in temperature of the switching element.

Alternatively, it is also possible to perform correction so as to compensate for the temperature deviation of the switching element by adding the correction reference V1 according to the temperature deviation of the switching element to the drain-source voltage $V_{DS}$ of the switching element instead of the overcurrent detection reference V. However, when the correction is performed according to the temperature of the switching element by adding the correction reference V1 to the drain-source voltage $V_{DS}$ of the switching element, a problem occurs in which the overcurrent detection reference V should be duplicated for each switching module of the inverter. Further, when the overcurrent detection reference V is greater than an output of the current supplier 52, a problem occurs in which the output of the current supplier 52 should be increased. When an output voltage of the current supplier 52 is increased, a material cost is increased.

Therefore, it is preferable to add the correction reference V1 to the overcurrent detection reference V, thereby compensating for the deviation of the overcurrent detection reference V due to the temperature of the switching element.

In the present disclosure, the overcurrent detection reference V is compensated for according to the temperature variation of the switching element such that the overcurrent applied to the switching element may be accurately detected. That is, in the present disclosure, the corrected overcurrent detection reference V' is used such that overcurrent detection accuracy of the switching element may be increased and stability of the switching element may be increased.

Figure 6:
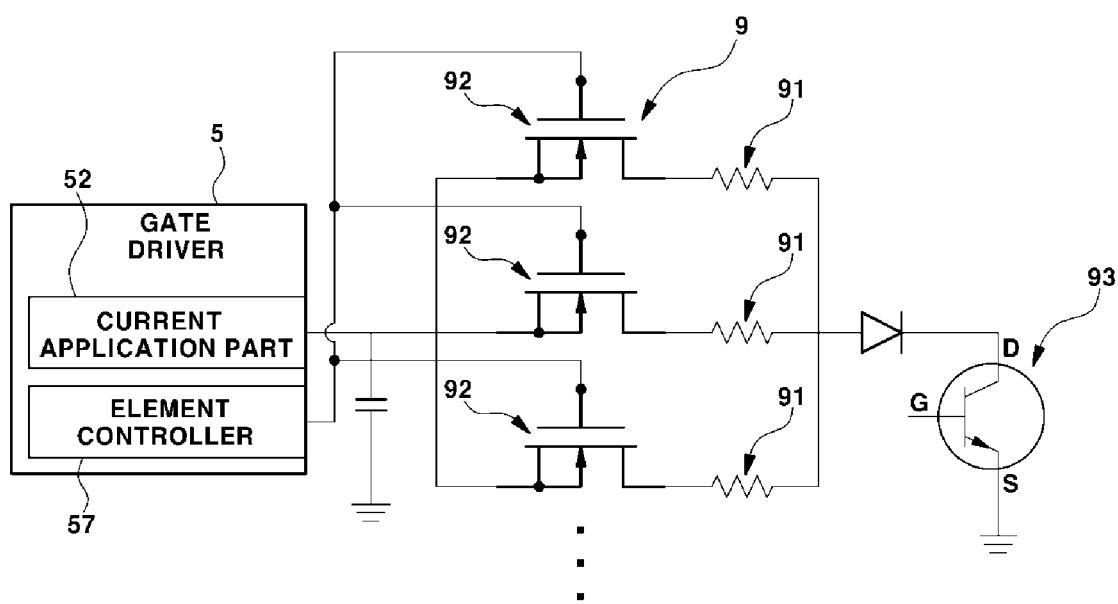
FIG. 6 is a diagram illustrating a variable resistor module connected to a drain terminal of the switching element.

Alternatively, it is also possible to cope with the temperature deviation of the switching element by varying the drain-source voltage of the switching element. That is, it is also possible to increase the overcurrent detection accuracy of the switching element by varying an actual drain-source voltage applied to the switching element according to a variation in temperature of the switching element without, as described above, compensating for the overcurrent detection reference V. To this end, as shown in FIG. 6, a variable resistor module 9 may be connected between the current supplier 52 of the gate driver 5 and a drain terminal D of a switching element 93. The variable resistor module 9 may include a plurality of resistors 91 connected in parallel and a current interrupt element 92 connected to each of the plurality of resistors 91 in series. The current interrupt element 92 may control a flow of a current flowing from the current supplier 52 to each of the resistors 91. The gate driver 5 may include an element controller 57 for controlling an operation of the current interrupt element 92. The operation of the current interrupt element 92 may be controlled by the element controller 57 of the gate driver 5. The flow of the current is controlled using the current interrupt element 92 such that the current may flow only to a selected resistor among the plurality of resistors 91. A resistance value and an amount of a voltage drop of the variable resistor module 9 are varied according to the number of conducting resistors among the plurality of resistors 91. Consequently, a drain-source voltage of the switching element 93 may be varied. The current interrupt element 92 may be a switching element such as a metal oxide semiconductor field effect transistor (MOSFET) or the like.

As described above, a voltage applied between the drain terminal D and a source terminal S of the switching element 93 is varied, it is possible to increase the overcurrent detection accuracy to correspond to a variation in temperature of the switching element 93.

Figure 7:
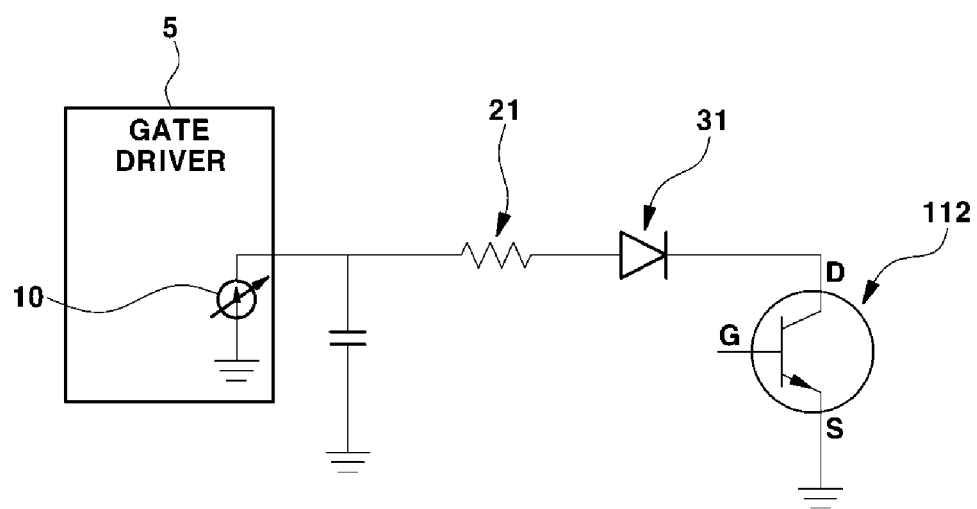
FIG. 7 is a diagram illustrating a variable current supplier connected to a drain terminal of a switching element.

Further, as shown in FIG. 7, in order to vary the drain-source voltage applied to the switching element according to the variation in temperature of the switching element, a variable current supplier 10 may be applied as a current source for supplying a current to a drain terminal D of a switching element 112. The variable current supplier 10 may be a current source provided in the gate driver 5. The current, which is supplied to the drain terminal D of the switching element 112 through the variable current supplier 10, is selectively varied such that the amount of the voltage drop, which is generated due to the resistor 21, the diode 31, and the switching element 112, may be varied and, as the amount of the voltage drop is varied, a drain-source voltage of the switching element 112 may be varied. As a result, the drain-source voltage of the switching element 112 is generated at a voltage level before the temperature deviation of the switching element 112 occurs. Consequently, it possible to increase the overcurrent detection accuracy to correspond to the variation in temperature of the switching element 112.

An overcurrent detection reference compensation system of a switching element for an inverter and an overcurrent detection system using the same according to the present disclosure may have the following effects.

1. An accurate overcurrent detection reference can be selected regardless of a variation in temperature of a switching element.

2. A deviation of the overcurrent detection reference according to a temperature of the switching element is compensated for such that a margin of the overcurrent detection reference can be reduced and thus accuracy of the overcurrent detection reference can be increased. Therefore, an overcurrent flowing in the switching element can be accurately detected such that safety of the switching element can be increased.

3. The margin of the overcurrent detection reference is reduced such that a switching loss of the switching element can be reduced and efficiency of an inverter can be improved.

4. A maximum output of the inverter, which can occur when a temperature of the switching element rises to a maximum temperature, can be increased.

The disclosure has been described in detail with reference to preferred embodiments thereof. However, it will be appreciated by those skilled in the art that changes may be made in these embodiments without departing from the principles and spirit of the disclosure, the scope of which is defined in the appended claims and their equivalents.

What is claimed is:

1. An overcurrent detection reference compensation system for an inverter, comprising:
a switching module having a plurality of switching elements which are connected in series;
a temperature detector configured to detect a temperature of each of the switching elements;
a correction reference determiner configured to calculate a difference between a set reference temperature and the temperature of at least one of the switching elements detected by the temperature detector, and determine a correction reference according to the calculated difference; and
a detection reference corrector configured to correct an overcurrent detection reference of each of the switching elements using the correction reference,
wherein the correction reference determiner includes:
a gain selector configured to determine a correction gain according to the difference between the temperature of the at least one of the switching elements and the reference temperature; and
a correction reference calculator configured to calculate the correction reference according to the difference using the correction gain.

2. The overcurrent detection reference compensation system of claim 1, wherein the temperature detector includes:
a diode module which is disposed in a housing in which the switching elements are embedded and receives a constant current; and
a temperature estimator configured to estimate, when the constant current is supplied to the diode module, the temperature of each of the switching elements on the basis of a voltage across both terminals of the diode module.

3. The overcurrent detection reference compensation system of claim 2, wherein the temperature estimator estimates the temperature of each of the switching elements using a temperature determination map in which the voltage across both terminals of the diode module is an input and the temperature of each of the switching elements is an output.

4. The overcurrent detection reference compensation system of claim 1, wherein the detection reference corrector calculates an overcurrent detection reference in which the deviation according to the temperature of each of the switching elements is corrected by adding the correction reference to the overcurrent detection reference.

5. The overcurrent detection reference compensation system of claim 1, wherein the switching elements include a field effect transistor (FET).

6. An overcurrent detection system for an inverter, comprising:
a switching module having a plurality of switching elements which are connected in series;
a temperature detector configured to detect a temperature of each of the switching elements;
a correction reference determiner configured to calculate a difference between a set reference temperature and a temperature of at least one of the switching elements detected by the temperature detector, and determine a correction reference according to the calculated difference;
a detection reference corrector configured to correct an overcurrent detection reference of each of the switching elements using the correction reference; and
an overcurrent detector configured to determine whether an overcurrent flows in each of the switching elements according to a result of comparing the overcurrent detection reference corrected in the detection reference corrector with a drain-source voltage of the switching elements,
wherein the correction reference determiner includes:
a gain selector configured to determine a correction gain according to the difference between the temperature of the at least one of the switching elements and the reference temperature; and
a correction reference calculator configured to calculate the correction reference according to the difference using the correction gain.

7. The overcurrent detection system of claim 6, wherein the overcurrent detector includes:
a voltage signal receiver which receives information on the drain-source voltage of the switching elements; and
an overcurrent determiner configured to determine, when the drain-source voltage received from the voltage signal receiver is equal to or less than the overcurrent detection reference corrected in the detection reference corrector, that the overcurrent is applied to the switching elements.

8. The overcurrent detection system of claim 7, wherein, when the drain-source voltage received from the voltage signal receiver exceeds the overcurrent detection reference corrected in the detection reference corrector, the overcurrent determiner determines that the overcurrent is not applied to the switching elements.

* * * * *